(12) United States Patent
Yamazaki

(10) Patent No.: US 6,886,120 B2
(45) Date of Patent: Apr. 26, 2005

(54) MEMORY CONTROL CIRCUIT

(75) Inventor: Atsushi Yamazaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 436 days.

(21) Appl. No.: 10/161,645

(22) Filed: Jun. 5, 2002

(65) Prior Publication Data
US 2002/0188899 A1 Dec. 12, 2002

(30) Foreign Application Priority Data
Jun. 7, 2001 (JP) ........................................ 172889/2001

(51) Int. Cl.$^7$ ............................ G11C 29/00; G11B 5/09
(52) U.S. Cl. ...................................... 714/721; 369/53.1
(58) Field of Search ........................... 714/721, 55, 811, 714/814, 815; 365/189.01, 230.01, 230.05; 711/100, 167, 154; 324/76.6; 369/53.34, 53.1

(56) References Cited

U.S. PATENT DOCUMENTS 5,392,174 A * 2/1995 Suzuki ..................... 360/78.06
6,556,524 B1 * 4/2003 Takeshita ................. 369/47.43
6,567,357 B1 * 5/2003 Kishimoto et al. ......... 369/53.14
6,636,569 B1 * 10/2003 McCarthy, Jr. ............ 375/316

* cited by examiner

Primary Examiner—Christine T. Tu
(74) Attorney, Agent, or Firm—Volentine Francos & Whitt PLLC

(57) ABSTRACT

A memory control circuit is connected between a CPU and a memory. The memory control circuit comprises an access control circuit for controlling reading/writing access speed between the CPU and the memory. The memory control circuit further comprises a speed measurement circuit for writing predetermined data into a given address of the memory at a first speed when a speed measurement mode is specified. Thereafter the speed measurement circuit reads out the data from the given address of the memory at a second speed hat is different from the first speed. Finally, the speed measurement circuit measures an optimum speed ensuring a normal reading operation.

10 Claims, 4 Drawing Sheets

MEMORY CONTROL CIRCUIT

FIELD OF THE INVENTION

The invention relates to a memory control circuit for controlling reading/wiring access speed in accordance with a speed of memory.

BACKGROUND OF THE INVENTION

Such a conventional technical field is disclosed, for example, in Japanese laid open publication No. H9-305477. The disclosed memory control circuit has an access speed register.

The access speed register is provided to set an access speed of a memory to be used by a hardware such as a dipswitch and the like by manually operating it. The set access speed information is stored in the access speed register and an access speed information signal is supplied to a controller.

However, according to the foregoing memory control circuit, a user has to set an access speed of the memory manually. Accordingly, there arise such problems that a troublesome operation is needed and the performance of the memory cannot be utilized to the maximum extent or the memory is erroneously operated when an erroneous access speed is set.

SUMMARY OF THE INVENTION

It is an object of the invention to provide a memory control circuit capable of setting an optimum access speed in accordance with characteristics of a memory without requiring a manual operation.

According to the invention, a memory control circuit is connected between a CPU and a memory. The memory control circuit comprises an access control circuit for controlling reading/writing access speed between the CPU and the memory. The memory control circuit further comprises a speed measurement circuit for writing predetermined data into a given address of the memory at a first speed when a speed measurement mode is specified. Thereafter the speed measurement circuit reads out the data from the given address of the memory at a second speed hat is different from the first speed. Finally, the speed measurement circuit measures an optimum speed ensuring a normal reading operation.

PREFERRED EMBODIMENT OF THE INVENTION

Figure 1:
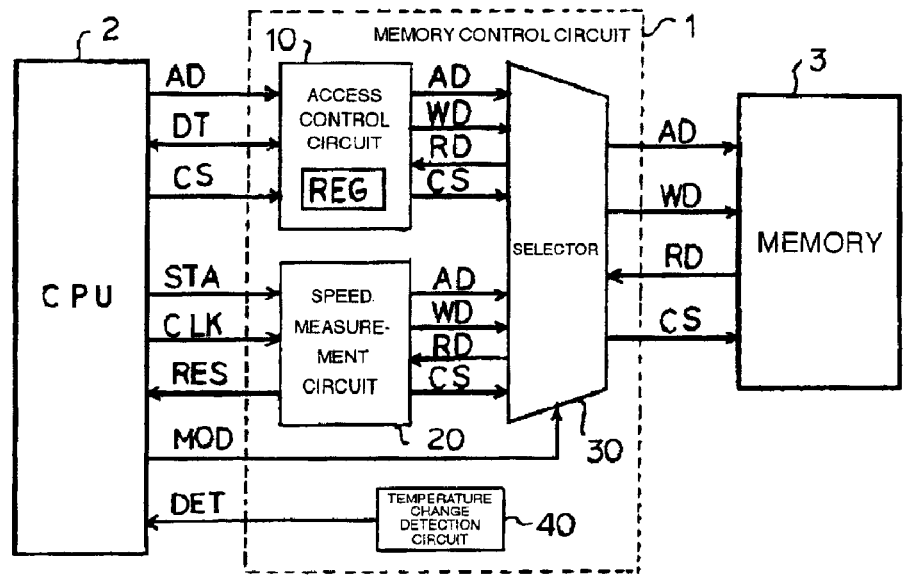
FIG. 1 is a view showing the configuration of a memory control circuit according to a first embodiment of the invention.
Figure 2:
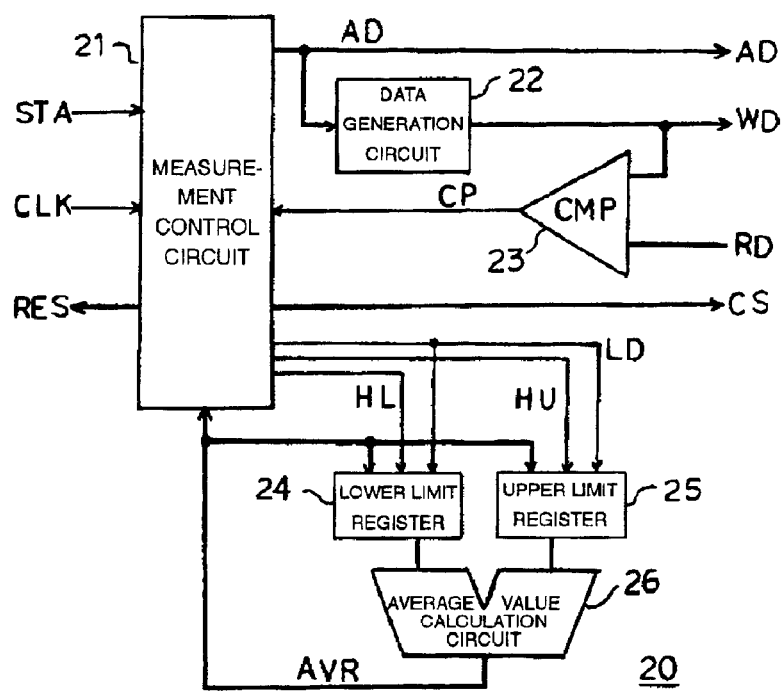
FIG. 2 is a view showing the configuration of a speed measurement circuit in FIG. 1.

FIG. 1 is a view showing the configuration of a memory control circuit according to a first embodiment of the invention;

FIG. 2 is a view showing the configuration of a speed measurement circuit in FIG. 1.

As shown in FIG. 1, a memory control circuit 1 is provided between CPU 2 and a memory 3 for controlling reading/writing access speed relative to the memory 3 in accordance with a speed of the memory 3 when the CPU 2 gains access to the memory 3. The memory control circuit 1 comprises an access control circuit 10, a speed measurement circuit 20, a selector 30 and a temperature variation detection circuit 40.

The access control circuit 10 effects conversion between an address signal AD, a data signal DT and a control signal CS at the side of the CPU 2 and an address signal AD, a write data WD, a read data RD and a control signal CS at the side of the memory 3, and also effects timing adjustment therebetween based on speed information set in a register (REG). The speed measurement circuit 20 measures an optimum data reading/writing access speed relative to the memory 3, for example, a system is setup or the memory 3 is replaced with another.

The access control circuit 10 and the speed measurement circuit 20 are connected to the memory 3 via the selector 30. The selector 30 is a selector switch for connecting between the speed measurement circuit 20 and the memory 3 when a speed measurement mode is specified in response to the mode signal MOD supplied from the CPU 2, and connecting between the access control circuit 10 and the memory 3 when a normal operation mode is specified.

The temperature variation detection circuit 40 remeasures an operation speed of the memory 3 when the operation speed of the memory 3 is varied depending on an ambient temperature and updates speed information to an appropriate value. The temperature variation detection circuit 40 comprises state detection means (for example, temperature sensor) and state holding means (for example, register) for holding the ambient temperature detected by the state detection means. The temperature variation detection circuit 40 has variation detection means (for example, comparator and the like) which compares the ambient temperature detected by the state detection means with the ambient temperature held by the state holding means under a normal operation mode, and outputting a variation detection signal DET for measuring speed when the difference between the foregoing ambient temperatures exceeds a given value.

The speed measurement circuit 20 has read/write control means and speed output means (for example, measurement control circuit) 21 for outputting a response signal RES representing the result of measurement upon receipt of a start signal STA and a clock signal CLK from the CPU 2. The measurement control circuit 21 outputs an address signal AD and a control signal CS. The address signal AD is supplied to data generation means (for example, data generation circuit) 22 and also to the memory 3 via the selector 30. The data generation circuit 22 generates write data WD for writing data into the memory 3 in response to the address signal AD supplied from the measurement control circuit 21. The write data WD is inputted to a first input of comparison means (for example, comparator (hereinafter referred to as CMP)) 23 and to the memory 3 via the selector 30.

Read data RD of the memory 3 is supplied to a second input of the CMP 23 via the selector 30. The CMP 23 compares the write data WD outputted from the data generation circuit 22 with the read data RD read out from the memory 3, and outputs a decision signal CP representing the decision as to whether a normal reading/writing operation is effected or not to the measurement control circuit 21.

The speed measurement circuit 20 also has a lower limit register 24 and an upper limit register 25. The lower limit register 24 holds a lower limit value of access speed (hereinafter referred to as lower limit access speed) and the upper limit register 25 holds an upper limit value of the access speed(hereinafter referred to as upper limit access speed). Both outputs of the lower limit register 24 and upper limit register 25 are connected to an average calculation circuit 26. The average calculation circuit 26 calculates an average value of each access speed held in the lower limit register 24 and upper limit register 25, and outputs an average speed AVR. The output of the average calculation circuit 26 is connected to the measurement control circuit 21 and also commonly connected to the inputs of the lower limit register 24 and upper limit register 25.

Both the lower limit register 24 and upper limit register 25 are structured such that a predetermined minimum value and maximum value are set upon receipt of a load signal LD supplied from the measurement control circuit 21. Further, the lower limit register 24 holds the average speed AVR outputted from the average calculation circuit 26 when a hold signal HL is supplied from the measurement control circuit 21. Still further, the upper limit register 25 holds the average speed AVR outputted from the average calculation circuit 26 when a hold signal HU is supplied from the measurement control circuit 21.

The measurement control circuit 21 comprises, for example, a state machine, which has a function to gain access to the memory 3 while varying write timing and read timing in sequence and to decide an optimum speed ensuring a normal reading/wring operation in the memory 3.

Figure 3:
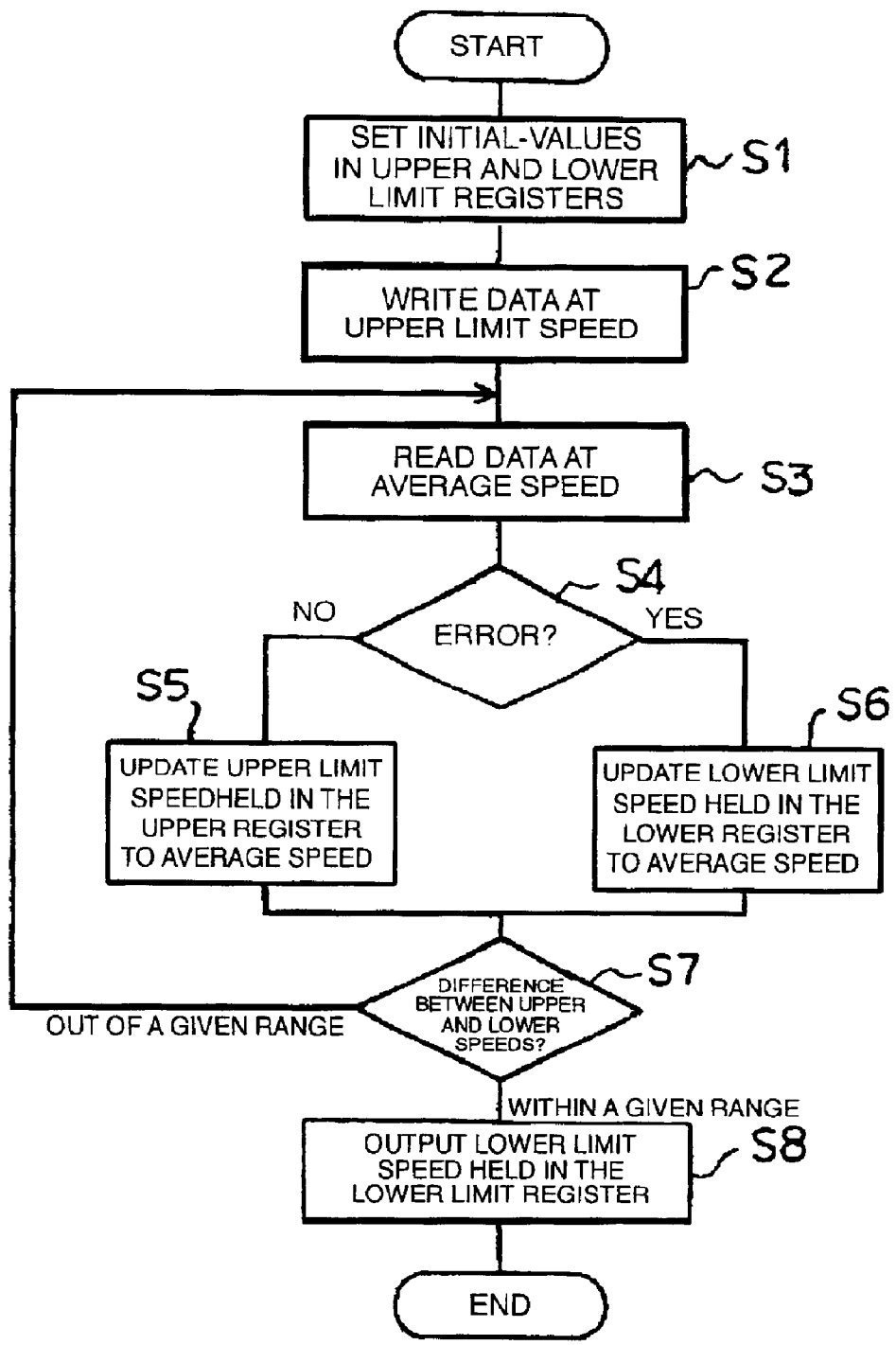
FIG. 3 is a flow chart showing an example of the operation in FIG. 1.
Figure 4:
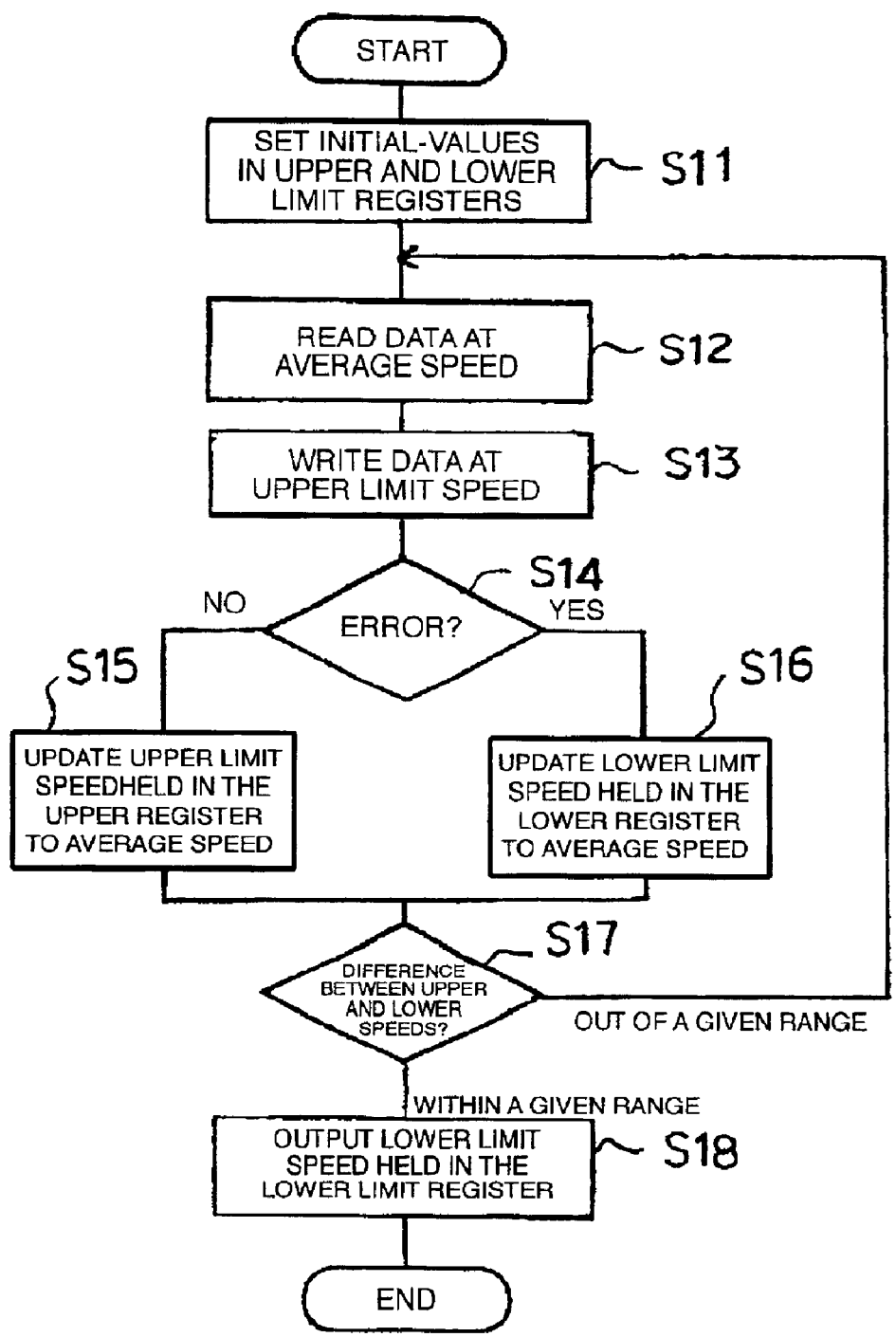
FIG. 4 is a flowchart showing another example of the operation in FIG. 1.

FIGS. 3 and 4 are flow charts showing the operation of the memory control circuit 1 in FIG. 1. FIG. 3 shows a measuring operation of a reading speed and FIG. 4 shows a measuring operation of a writing speed. The operation of the memory control circuit 1 in FIG. 1 is described next with reference to FIGS. 3 and 4.

A speed measurement mode is specified by the CPU 2 in response to the mode signal MOD supplied from the CPU 2 when a system is setup or the memory 3 is replaced by another. As a result, the selector 30 is switched to the speed measurement circuit 20 and the access control circuit 10 is disconnected from the selector 30 so that the speed measurement circuit 20 is connected to the memory 3. Further, the measurement of an access speed of the memory 3 is started by the speed measurement circuit 20 when the start signal STA is supplied from the CPU 2.

First, in step S1 in FIG. 3, the load signal LD is outputted from the measurement control circuit 21 and initial-values of access speed (for example, the number of clocks needed for access) are set in the lower limit register 24 and upper limit register 25. Accordingly, for example, the minimum value (for example, 10 clocks) of the access speed is set in the lower limit register 24 and the maximum value (for example, 20 clocks) of the access speed is set in the upper limit register 25. The values held in the lower limit register 24 and upper limit register 25 are supplied to the average calculation circuit 26, and the average speed AVR (15 clocks in this case) is calculated by the average calculation circuit 26. A program goes to step S2 after step S1.

In step S2, data is written into multiple addresses (for example, 0 address and 1 address) of the memory 3 at the upper limit speed that is set in the upper limit register 25. That is, the address signal AD specifying 0 address is outputted from the measurement control circuit 21, and it is supplied to the memory 3 and the data generation circuit 22. As a result, data representing, for example, all "0" (hereinafter referred to as all "0" data) is generated in the data generation circuit 22 and it is supplied to the memory 3 as the write data WD. At the same time, the control signal CS specifying writing into the memory 3 is outputted from the measurement control circuit 21, and all "0" data is written into 0 address of the memory 3.

Subsequently, the address signal AD specifying 1 address is out putted from the measurement control circuit 21, data representing, for example, all "1" (hereinafter referred to as all "1" data) is generated in the data generation circuit 22 and it is supplied to the memory 3. At the same time, the control signal CS specifying writing into the memory 3 is outputted from the measurement control circuit 21, and all "1" data is written into the memory 3. Data can be reliably written into the memory 3 since data are written into 0 address and 1 address of the memory 3 at the upper limit speed.

In step S3, data stored in 0 address and 1 address of the memory 3 are sequentially read out by the measurement control circuit 21 at the average speed AVR calculated by the average calculation circuit 26. The address signal AD specifying 0 address is first outputted from the measurement control circuit 21, and all "0" data is generated in the data generation circuit 22, and it is supplied to the first input of the CMP 23. Meanwhile, the read data RD stored in 0 address is outputted from the memory 3, and it is supplied to the second input of the CMP 23. Two data are compared with each other in the CMP 23, and the decision signal CP representing result of the comparison is supplied to the measurement control circuit 21.

In step S4, it is decided as to whether data read out from the memory 3 is correct or not. If there is no error in data, a program goes to step S5 while if there is the error in data, a program goes to step S6.

When read out data is correct, the holding signal HU is outputted from the measurement control circuit 21 to the upper limit register 25 in step S5. As a result, the upper limit speed held in the upper limit register 25 is updated to the average speed AVR (for example, 15 clocks). Meanwhile, if there is an error in the readout data, the holding signal HL is outputted from the measurement control circuit 21 to the lower limit register 24 in step S6. As a result, the lower limit speed held in the lower limit register 24 is updated to the average speed AVR. The program goes to step S7 after the step S5 or S6.

Instep S7, it is decided as to whether the difference between the lower limit speed held in the lower limit register 24 and upper limit speed held in the upper limit register 25 is equal to or less than a given value (for example, 3 clocks) or not. If the difference in speed is, for example, equal to or less than a given value, the program goes to the step S8, while if the difference in speed exceeds, for example, the given value, the program returns to the step S3 where processes in the steps S3 to S7 are repeated.

In step S8, the lower limit speed held in the lower limit register 24 is considered to be an optimum reading access speed and it is outputted from the measurement control circuit 21 to the CPU 2 as the response signal RES.

Then, in step S11 shown in FIG. 4, the load signal LD is outputted from the measurement control circuit 21 so that initial values are set in the lower limit register 24 and upper limit register 25 in the same manner as step S1 in FIG. 3. The values held in the lower limit register 24 and upper limit register 25 are supplied to the average calculation circuit 26 where the average speed AVR is calculated. The program goes to step S12 after step S11.

In step S12, data is written from the measurement control circuit 21 into 0 address and 1 address of the memory 3 at the average speed AVR. In this case, if all "0" data is written into the memory 3 last time, the data generation circuit 22 generates data generates all "1" data this time so that data which is different from that written into the memory 3 last time is generated in the measurement control circuit 21.

In step S13, data is read out from the memory 3 at the upper limit speed held in the upper limit register 25 so as to prevent the occurrence of error when reading out data.

In step S14, it is decided as to whether data read out from the memory 3 is correct or not. If there is no error in data, the program goes to step S15 while if there is an error, the program goes to step S16.

If the read out data is correct, the holding signal HU is outputted from the measurement control circuit 21 in step S15, so that the upper limit speed held in the upper limit register 25 is updated to the average speed AVR. Meanwhile, if there is an error in the read out data, the holding signal HL is outputted from the measurement control circuit 21 in step S16 so that the lower limit speed held in the lower limit register 24 is updated to the average speed AVR. The program goes to the step S17 after step S15 or S16.

In step S17, it is decided as to whether the difference between the lower limit speed held in the lower limit register 24 and the upper limit speed held in the upper limit register 25 is equal to or less than a given value or not. If the difference in speed is, for example, equal to or less than a given value, the program goes to step S18 while if it exceeds, for example, the given value, the program returns to step S12 where processes in steps S12 to S17 are repeated.

In step S18, the lower limit speed held in the lower limit register 24 is considered to be an optimum writing access speed and it is outputted from the measurement control circuit 21 to the CPU 2 as the response signal RES.

The CPU 2 generates optimum writing/reading speed information relative to the memory 3 in response to the response signal RES supplied from the measurement control circuit 21, which information can be stored in the register of the access control circuit 10.

Thereafter, the CPU 2 changes the mode signal MOD to a normal operation mode. As a result, the speed measurement circuit 20 of the memory control circuit 1 is disconnected from the CPU 2, and the access control circuit 10 is connected to the memory 3 via the selector 30.

As mentioned above, when the speed measurement mode is specified by the CPU 2, the memory control circuit 1 in the first embodiment has the speed measurement circuit 20 which changes access speed sequentially relative to the memory 3 so as to effect data reading/writing, thereby measuring the optimum reading speed and the writing speed. As a result, reading/writing access can be effected in the CPU 2 at the optimum speed that is suitable for the characteristics of the memory 3.

Further, the memory control circuit 1 has the temperature variation detection circuit 40 for outputting a temperature variation signal DAT when the temperature under a speed measurement mode is varied not less than a given value upon detection of the variation in ambient temperature. As a result, even if operating speed of the memory 3 is changed by the ambient temperature, there is an advantage to remeasure the operating speed so as to update the speed information to a correct value.

Figure 5:
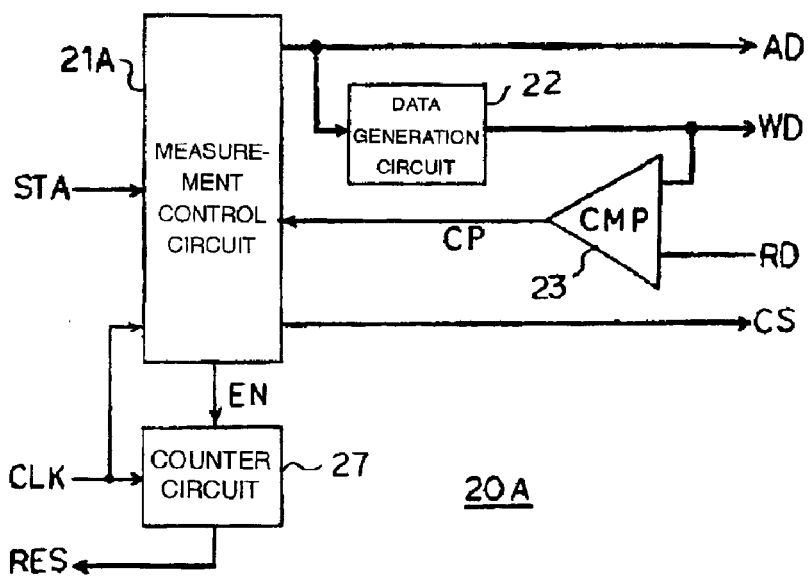
FIG. 5 is a view showing the configuration of a speed measurement circuit according to a second embodiment of the invention.

FIG. 5 is a view showing the configuration of a speed measurement circuit 20A according to a second embodiment of the invention, and components that are common to those of FIG. 2 are depicted by the same reference numerals.

A speed measurement circuit 20A is provided instead of the speed measurement circuit 20 as shown in FIG. 2 and measures an optimum reading access speed relative to a memory 3 and outputs it to a CPU 2 as a response signal RES. The speed measurement circuit 20A has a measurement control circuit 21A upon receipt of a start signal STA and a clock signal CLK from the CPU 2.

The measurement control circuit 21A outputs an address signal AD and a control signal CS to the memory 3 via a selector 30. The address signal AD is supplied to an input of the selector 30 and also to a data generation circuit 22. The data generation circuit 22 generates a write data WD for writing data into the memory 3 in response to the address signal AD supplied from the measurement control circuit 21A. The write data WD is supplied to the memory 3 via the selector 30 and also to a first input of a CMP 23.

Read data RD of the memory 3 is supplied to a second input of the CMP 23 via the selector 30. The CMP 23 compares the write data WD outputted from the data generation circuit 22 with the read data RD read out from the memory 3, and outputs a decision signal CP representing the result of comparison to the measurement control circuit 21A.

A counter circuit 27 is provided in the speed measurement circuit 20A. The counter circuit 27 counts the clock signal CLK upon receipt of an enable signal EN supplied from the measurement control circuit 21A and outputs the counted value to the CPU 2 as a measurement result signal RES.

Figure 6:
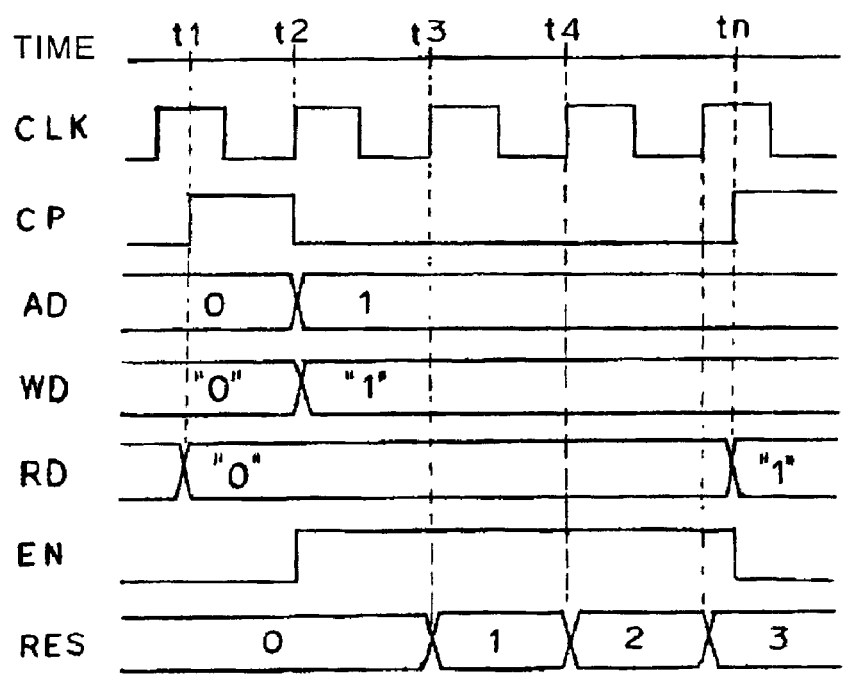
FIG. 6 is a view showing signal waveforms generated during the operation of the memory control circuit shown in FIG. 5.

FIG. 6 is a view showing signal waveforms generated during the operation of the memory control circuit shown in FIG. 5. The operation of the memory control circuit shown in FIG. 5 is described next with FIG. 6.

Different data written into 0 address and 1 address of the memory 3. That is, the address signal AD specifying 0 address is out putted from the measurement control circuit 21 A and it is supplied to the memory 3 and the data generation circuit 22. As a result, for example, all "0" write data WD is generated in the data generation circuit 22 and is written into 0 address of the memory 3. Thereafter, the address signal AD specifying 1 address is outputted from the measurement control circuit 21A, and all "1" data is generated in the data generation circuit 22 which is written into 1 address of the memory 3. Data is written into 0 address and 1 address of the memory 3 at a speed ensuring reliable writing. The counter circuit 27 can be reset by a reset signal (not shown).

Then, the address signal AD specifying 0 address is outputted from the measurement control circuit 21A. Data generated in the data generation circuit 22 and read data RD read out from 0 address of the memory 3 are monitored by the CMP 23.

When data in 0 address of the memory 3 is read out correctly at time t1, the decision signal CP outputted from the CMP 23 has "H" level representing "concordance".

Thereafter, at the leading edge of the clock signal CLK at time t2, the measurement control circuit 21A changes the address signal AD to that specifying 1 address and also changes the enable signal EN relative to the counter circuit 27 to be in "H" level. As a result, the counter circuit 27 starts a count-up operation from 0 in response to the clock signal CLK. Meanwhile, all "1" write data WD corresponding to 1 address is outputted from the data generation circuit 22. Since read data RD of the memory 3 is not changed to all "1" data at this moment, the decision signal CP of the CMP 23 is changed to be in "L" representing "discordance ".

At the leading edge of the clock signal CLK at time t3, t4, . . . counted values in the counter circuit 27 are sequentially counted up to 1, 2, . . . .

Read data RD read out from the memory 3 is changed to all "1" at time tn, the decision signal CP of the CMP 23 is changed to be in "H" level. The measurement control circuit 21A detects that the decision signal CP is changed to be in "H" level, and changes the enable signal EN relative to the counter circuit 27 to be in "L" level. As a result, the operation of the counter circuit 27 is stopped and the counted value is fixed. The counted value of the counter circuit 27 is outputted as the response signal RES representing the result of measurement of the minimum read delay time of the memory 3.

As mentioned above, the speed measurement circuit 20A according to the second embodiment has the counter circuit 27 for counting the number of clocks until the read data RD read out from the memory 3 equals to previously written data upon specification of the AD. As a result, there is an advantage that the read delay time of the memory 3 can be measured with a simple construction.

The invention is not limited, for example, to the foregoing first and second embodiments but can be modified variously. For example, there are following modifications.

Although the optimum speed can be decided by use of the lower limit register 24, the upper limit register 25 and the average calculation circuit 26 provided in the speed measurement circuit 20, an optimum speed ensuring correct data reading/wring can be determined, for example, by increasing or decreasing the access speed sequentially.

A voltage variation detection circuit for detecting variation of a power supply voltage may be provided instead of the temperature variation detection circuit 40. Further, the temperature variation detection circuit 40 can be dispensed with by allowing the maximum speed leeway to somewhat large extent.

Although the response signal RES of the speed measurement circuit 20 is outputted to the CPU 2 in the memory control circuit 1, speed information corresponding to the response signal RES may be stored in a register of the access control circuit 10. As a result, the process by the CPU 2 can be simplified.

A method claim can be claimed from the present invention. For example, a method of controlling a memory for controlling reading/writing access speed when a CPU gains access to a memory in accordance with a speed of the memory to be controlled, can be claimed. The method of controlling a memory comprises a process for setting an upper limit data writing speed relative to the memory in an upper limit register and a lower limit data writing speed relative to the memory in a lower limit register when a speed measurement mode is specified; a process of calculating an average speed of the upper limit data writing speed and lower limit data writing speed; a process of writing predetermined data into a given address of the memory at the average speed, thereafter reading out the same data from the memory at a speed ensuring reliable data reading without error; a process of comparing the data written into the memory with the data read out from the memory and deciding whether a normal writing operation can be effected or not; a process of updating the upper limit speed held in the upper limit register or the lower limit speed held in the lower limit register on the basis of the result of the decision; and a process of deciding an optimum speed ensuring a normal writing operation in the memory on the basis of the upper limit speed held in the upper limit register or the lower limit speed held in the lower limit register, and outputting information of the result of the decision.

Further, the following method claim can be claimed such as a method of controlling a memory for controlling reading/writing access speed when a CPU gains access to a memory in accordance with a speed of the memory to be controlled comprising: a process for setting an upper limit data reading speed relative to the memory in an upper limit register and a lower limit data reading speed relative to the memory in a lower limit register when a speed measurement mode is specified; a process of calculating an average speed of the upper limit data reading speed and lower limit data reading speed; a process of writing predetermined data into a given address of the memory at a speed ensuring reliable data writing without error, thereafter reading out the same data from the memory at the average speed; a process of comparing the data written into the memory and the data read out from the memory and deciding whether a normal reading operation is effected or not; a process of updating the upper limit data reading speed held in the upper limit register or the lower limit data reading speed held in the lower limit register on the basis of the result of decision; and a process of deciding an optimum speed ensuring a normal reading operation in the memory on the basis of the upper limit data reading speed held in the upper limit register or the lower limit data reading speed held in the lower limit register, and outputting information of decision.

Further, the following method claim can be claimed such as a method of controlling a memory for controlling reading/writing access speed when a CPU gains access to a memory in accordance with a speed of the memory to be controlled comprising: a process for setting an upper limit data, a process of writing the predetermined data into a given address of the memory at a speed ensuring reliable data writing without error; a process of measuring time until data read out from the address upon gaining access to the memory accords with data written into the memory; a process of deciding an optimum speed ensuring a normal reading operation in the memory on the basis of the measured time and outputting information of decision. In the first example claim, the following clause can be added such as a process of deciding the optimum speed, and detecting and storing an ambient temperature or an environment state of a power supply voltage in the memory at the time when the information is outputted; and a process of detecting the ambient temperature or the environment state of the power supply voltage under the normal operation mode, comparing the environment state with the environment state stored in the memory and outputting a variation detection signal for remeasuring the optimum speed when a difference between both environment states exceeds a given value.

What is claimed is:

1. A memory control circuit connected to a CPU and a memory, the memory control circuit comprising:
   an access control circuit for controlling reading/writing access speed between the CPU and the memory; and
   a speed measurement circuit for writing predetermined data into a given address of the memory at a first speed when a speed measurement mode is specified, thereafter reading out the data from the given address of the memory at a second speed that is different from the first speed, and measuring an optimum speed ensuring a normal reading operation.

2. The memory control circuit according to claim 1, wherein the speed measurement circuit comprises:
   a read/write control circuit for outputting an address signal for specifying the given address and controlling data reading/writing relative to the memory to be controlled at the speed different from the speed of the memory;

a data generation circuit for generating the predetermined data in response to the address signal;

a comparator for comparing data which is generated by the data generation circuit with data read out from the memory to be controlled, and outputting a decision signal for deciding as to whether a normal reading or writing operation can be effected or not; and a speed output circuit for outputting information of an optimum speed ensuring a normal reading or writing operation in the memory in response to the decision signal.

3. The memory control circuit according to claim 1, wherein the speed measurement circuit comprises:

an upper limit register for holding an upper reading/writing limit speed relative to the memory;

a lower limit register for holding a lower reading/writing limit speed relative to the memory;

an average value calculation circuit for calculating an average speed held in the upper limit speed ensuring holding data in the upper limit register and the lower limit speed ensuring holding data in the lower limit register;

a read/write control circuit for outputting an address signal for specifying the predetermined address and controlling reading/writing relative to the memory to be controlled at the average speed;

a data generation circuit for generating the predetermined data in response to the address signal;

a comparator for comparing data which is generated by the data generation circuit with data read out from the memory to be controlled, and outputting a decision signal for deciding whether a normal reading/writing operation can be effected or not;

a speed update circuit for updating the upper limit speed held in the upper limit register or the lower limit speed held in the lower limit register in response to the decision signal; and a speed output circuit for deciding an optimum speed ensuring a normal reading or writing operation can be effected in the memory on the basis of the upper limit speed held in the upper limit register and the lower limit speed held in the lower limit register and outputting the decided optimum speed information.

4. The memory control circuit according to claim 1, further comprising:

a state detection circuit for detecting an environment state of an ambient temperature or a power supply voltage;

a state holding circuit for holding the environment state detected by the state detection circuit under the speed measurement mode; and a variation detection circuit for comparing the environment state detected by the state detection circuit with the environment state held by the state holding circuit, and outputting a variation detection signal for effecting speed measurement when a difference between both environment states exceeds a given value under a normal operation mode.

5. A memory control circuit connected to a CPU and a memory, the memory control circuit comprising:

an access control circuit for controlling reading/writing access speed between the CPU and the memory; and a speed measurement circuit for writing predetermined data into a given address of the memory when a speed measurement mode is specified, thereafter measuring time until data read out from the address upon gaining access to the address discords with data written into the memory, and measuring an optimum speed ensuring a normal reading operation.

6. The memory control circuit according to claim 5, further comprising:

a state detection circuit for detecting an environment state of an ambient temperature or a power supply voltage;

a state holding circuit for holding the environment state detected by the state detection circuit under the speed measurement mode; and a variation detection circuit for comparing the environment state detected by the state detection circuit with the environment state held by the state holding circuit, and outputting a variation detection signal for effecting speed measurement when a difference between both environment states exceeds a given value under a normal operation mode.

7. A memory control circuit connected to a CPU and a memory, the memory control circuit comprising:

an access control circuit for controlling reading/writing access speed between the CPU and the memory; and a speed measurement circuit for writing predetermined data into a given address of the memory when a speed measurement mode is specified, thereafter reading out the data from the given address of the memory, thereby measuring an optimum speed ensuring a normal reading operation.

8. The memory control circuit according to claim 7, wherein the speed measurement circuit comprises:

a read/write control circuit for outputting an address signal for specifying the given address and controlling data reading/writing relative to the memory to be controlled at the speed different from the speed of the memory;

a data generation circuit for generating the predetermined data in response to the address signal;

a comparator for comparing data which is generated by the data generation circuit with data read out from the memory to be controlled, and outputting a decision signal for deciding as to whether a normal reading or writing operation can be effected or not; and a speed output circuit for outputting information of an optimum speed ensuring a normal reading or writing operation in the memory in response to the decision signal.

9. The memory control circuit according to claim 7, wherein the speed measurement circuit comprises:

an upper limit register for holding an upper reading/writing limit speed relative to the memory;

a lower limit register for holding a lower reading/writing limit speed relative to the memory;

an average value calculation circuit for calculating an average speed held in the upper limit speed ensuring holding data in the upper limit register and the lower limit speed ensuring holding data in the lower limit register;

a read/write control circuit for outputting an address signal for specifying the predetermined address and controlling reading/writing relative to the memory to be controlled at the average speed;

a data generation circuit for generating the predetermined data in response to the address signal;

a comparator for comparing data which is generated by the data generation circuit with data read out from the memory to be controlled, and outputting a decision signal for deciding whether a normal reading/writing operation can be effected or not;

a speed update circuit for updating the upper limit speed held in the upper limit register or the lower limit speed held in the lower limit register in response to the decision signal; and a speed output circuit for deciding an optimum speed ensuring a normal reading or writing operation can be effected in the memory on the basis of the upper limit speed held in the upper limit register and the lower limit speed held in the lower limit register and outputting the decided optimum speed information.

10. The memory control circuit according to claim 7, further comprising:

a state detection circuit for detecting an environment state of an ambient temperature or a power supply voltage;

a state holding circuit for holding the environment state detected by the state detection circuit under the speed measurement mode; and a variation detection circuit for comparing the environment state detected by the state detection circuit with the environment state held by the state holding circuit, and outputting a variation detection signal for effecting speed measurement when a difference between both environment states exceeds a given value under a normal operation mode.

* * * * *